US010284217B1

(12) United States Patent
Schneider et al.

(10) Patent No.: US 10,284,217 B1
(45) Date of Patent: *May 7, 2019

(54) MULTI-PATH ANALOG FRONT END AND ANALOG-TO-DIGITAL CONVERTER FOR A SIGNAL PROCESSING SYSTEM

(71) Applicant: Cirrus Logic International Semiconductor Ltd., Edinburgh (GB)

(72) Inventors: Edmund Mark Schneider, Austin, TX (US); Daniel J. Allen, Austin, TX (US); Aniruddha Satoskar, Round Rock, TX (US); Seyedeh Maryam Mortazavi Zanjani, Austin, TX (US); Brian P. Chesney, Bee Cave, TX (US); John C. Tucker, Austin, TX (US); Christophe J. Amadi, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/882,640

(22) Filed: Jan. 29, 2018

Related U.S. Application Data

(63) Continuation-in-part of application No. 15/694,129, filed on Sep. 1, 2017, now abandoned, which is a
(Continued)

(51) Int. Cl.
*H03M 1/18* (2006.01)
*H04R 3/04* (2006.01)
(Continued)

(52) U.S. Cl.
CPC ............ *H03M 1/188* (2013.01); *G10K 11/16* (2013.01); *H03M 1/002* (2013.01);
(Continued)

(58) Field of Classification Search
CPC ........ H03M 1/188; H03M 1/0626; H04R 3/02
(Continued)

(56) References Cited

U.S. PATENT DOCUMENTS 3,683,164 A * 8/1972 Minami ............... G06G 7/1914
324/76.33
4,129,864 A * 12/1978 Carpenter ............. H03M 1/124
324/115
(Continued)

FOREIGN PATENT DOCUMENTS

EP 0351788 A2 7/1989
EP 1244218 A1 9/2002
(Continued)

OTHER PUBLICATIONS

International Search Report and Written Opinion of the International Searching Authority, International Application No. PCT/US2016/065134, dated Mar. 15, 2017.
(Continued)

*Primary Examiner* — Gerald Gauthier
(74) *Attorney, Agent, or Firm* — Jackson Walker L.L.P.

(57) ABSTRACT

In accordance with embodiments of the present disclosure, a processing system may include multiple selectable processing paths for processing an analog signal in order to reduce noise and increase dynamic range. Techniques are employed to transition between processing paths and calibrate operational parameters of the two paths in order to reduce or eliminate artifacts caused by switching between processing paths.

32 Claims, 4 Drawing Sheets

600

| MAGNITUDE OF ANALOG_IN (IN DECIBELS RELATIVE TO FULL SCALE MAGNITUDE) | WEIGHT APPLIED TO OUTPUT OF PROCESSING PATH 201a | WEIGHT APPLIED TO OUTPUT OF PROCESSING PATH 201b |
|---|---|---|
| ≥-28 | 0.00 | 1.00 |
| -29 | 0.22 | 0.78 |
| -30 | 0.41 | 0.59 |
| -31 | 0.54 | 0.46 |
| -32 | 0.67 | 0.33 |
| -33 | 0.75 | 0.25 |
| -34 | 0.84 | 0.16 |
| -35 | 0.91 | 0.09 |
| ≤-36 | 1.00 | 0.00 |

Related U.S. Application Data continuation of application No. 14/596,826, filed on Jan. 14, 2015, now Pat. No. 9,774,342, which is a continuation-in-part of application No. 14/476,507, filed on Sep. 3, 2014, now Pat. No. 9,525,940.

(60) Provisional application No. 61/948,307, filed on Mar. 5, 2014.

(51) Int. Cl.
| | |
|---|---|
| *H04R 3/02* | (2006.01) |
| *G10K 11/16* | (2006.01) |
| *H03M 3/00* | (2006.01) |
| *H03M 1/00* | (2006.01) |
| *H03M 1/06* | (2006.01) |

(52) U.S. Cl.
CPC ........ *H03M 1/0631* (2013.01); *H03M 1/181* (2013.01); *H03M 3/466* (2013.01); *H04R 3/02* (2013.01); *H04R 3/04* (2013.01); *H03M 1/18* (2013.01); *H04R 2420/01* (2013.01); *H04R 2430/03* (2013.01)

(58) Field of Classification Search
USPC .............. 340/578; 341/120, 138, 139, 155; 348/687; 360/39, 51; 375/229, 308, 324, 375/350; 381/57, 94.5, 107; 455/553.1; 708/818; 716/113; 600/25; 704/226
See application file for complete search history.

(56) References Cited

U.S. PATENT DOCUMENTS

| | | | |
|---|---|---|---|
| 4,346,349 A | 8/1982 | Yokoyama | |
| 4,441,081 A | 4/1984 | Jenkins | |
| 4,446,440 A | 5/1984 | Bell | |
| 4,493,091 A | 1/1985 | Gundry | |
| 4,628,526 A * | 12/1986 | Germer | H03G 3/32 381/108 |
| 4,890,107 A | 12/1989 | Pearce | |
| 4,999,628 A * | 3/1991 | Kakubo | H03M 1/188 341/139 |
| 5,077,539 A | 12/1991 | Howatt | |
| 5,198,814 A | 3/1993 | Ogawara et al. | |
| 5,202,686 A * | 4/1993 | Rapp | G01J 3/453 341/138 |
| 5,212,551 A | 5/1993 | Conanan | |
| 5,272,449 A | 12/1993 | Izawa | |
| 5,343,161 A | 8/1994 | Tokumo et al. | |
| 5,434,560 A * | 7/1995 | King | G08B 17/02 340/577 |
| 5,495,505 A * | 2/1996 | Kundmann | G06F 1/0328 375/303 |
| 5,719,641 A | 2/1998 | Mizoguchi | |
| 5,771,301 A * | 6/1998 | Fuller | H03G 7/002 381/104 |
| 5,796,303 A | 8/1998 | Vinn et al. | |
| 6,160,455 A | 12/2000 | French et al. | |
| 6,260,176 B1 * | 7/2001 | Chen | G06F 17/5036 714/814 |
| 6,333,707 B1 | 12/2001 | Oberhammer et al. | |
| 6,542,612 B1 | 4/2003 | Needham | |
| 6,614,297 B2 | 9/2003 | Score et al. | |
| 6,683,494 B2 | 1/2004 | Stanley | |
| 6,798,370 B1 * | 9/2004 | Nagano | H03M 1/002 341/155 |
| 6,810,266 B1 * | 10/2004 | Ecklund | H04B 1/406 375/216 |
| 6,897,794 B2 | 5/2005 | Kuyel et al. | |
| 6,989,955 B2 | 1/2006 | Ziemer et al. | |
| 7,279,964 B2 | 10/2007 | Bolz et al. | |
| 7,302,354 B2 | 11/2007 | Zhuge | |
| 7,312,734 B2 | 12/2007 | McNeill et al. | |
| 7,315,204 B2 | 1/2008 | Seven | |
| 7,365,664 B2 | 4/2008 | Caduff et al. | |
| 7,378,902 B2 | 5/2008 | Sorrells et al. | |
| 7,385,443 B1 | 6/2008 | Denison | |
| 7,671,768 B2 | 3/2010 | De Ceuninck | |
| 7,733,592 B2 * | 6/2010 | Hutchins | H03L 7/07 360/26 |
| 7,737,776 B1 | 6/2010 | Cyrusian | |
| 7,924,189 B2 | 4/2011 | Sayers | |
| 7,937,106 B2 | 5/2011 | Sorrells et al. | |
| 7,952,502 B2 | 5/2011 | Kolze et al. | |
| 8,130,126 B2 | 3/2012 | Breitschaedel et al. | |
| 8,194,889 B2 | 6/2012 | Seefeldt | |
| 3,483,753 A1 | 7/2013 | Behzad et al. | |
| 8,508,397 B2 | 8/2013 | Hisch | |
| 8,786,477 B1 | 7/2014 | Albinet | |
| 8,836,551 B2 | 9/2014 | Nozaki | |
| 8,878,708 B1 | 11/2014 | Sanders et al. | |
| 9,071,201 B2 | 6/2015 | Jones et al. | |
| 9,071,267 B1 | 6/2015 | Schneider et al. | |
| 9,118,401 B1 | 8/2015 | Nieto et al. | |
| 9,171,552 B1 | 10/2015 | Yang | |
| 9,178,462 B2 | 11/2015 | Kurosawa et al. | |
| 9,210,506 B1 | 12/2015 | Nawfal et al. | |
| 9,337,795 B2 | 5/2016 | Das et al. | |
| 9,444,504 B1 | 9/2016 | Robinson et al. | |
| 9,525,940 B1 | 12/2016 | Schneider et al. | |
| 9,543,975 B1 | 1/2017 | Melanson et al. | |
| 9,584,911 B2 | 2/2017 | Das et al. | |
| 9,596,537 B2 | 3/2017 | He et al. | |
| 9,635,310 B2 | 4/2017 | Chang et al. | |
| 9,680,488 B2 | 6/2017 | Das et al. | |
| 9,762,255 B1 | 9/2017 | Satoskar et al. | |
| 9,774,342 B1 | 9/2017 | Schneider et al. | |
| 9,780,800 B1 * | 10/2017 | Satoskar | H03M 1/0607 |
| 9,807,504 B2 | 10/2017 | Melanson et al. | |
| 9,813,814 B1 | 11/2017 | Satoskar | |
| 9,831,843 B1 | 11/2017 | Das et al. | |
| 9,917,557 B1 | 3/2018 | Zhu et al. | |
| 9,929,703 B1 | 3/2018 | Zhao | |
| 2001/0001547 A1 | 5/2001 | Delano et al. | |
| 2003/0208099 A1 * | 11/2003 | Ball | H04R 25/30 600/25 |
| 2004/0078200 A1 | 4/2004 | Alves | |
| 2005/0068097 A1 | 3/2005 | Kirn et al. | |
| 2005/0068211 A1 * | 3/2005 | Arai | H03M 1/188 341/138 |
| 2005/0084037 A1 | 4/2005 | Liang | |
| 2006/0064037 A1 | 3/2006 | Shalon et al. | |
| 2006/0261886 A1 | 11/2006 | Hansen et al. | |
| 2007/0018719 A1 | 1/2007 | Seven | |
| 2007/0026837 A1 | 2/2007 | Bagchi | |
| 2007/0142943 A1 | 6/2007 | Torrini et al. | |
| 2007/0146069 A1 | 6/2007 | Wu et al. | |
| 2008/0012639 A1 | 1/2008 | Mels | |
| 2008/0114239 A1 | 5/2008 | Randall et al. | |
| 2008/0143436 A1 | 6/2008 | Xu | |
| 2008/0198048 A1 | 8/2008 | Klein et al. | |
| 2008/0278632 A1 * | 11/2008 | Morimoto | H04N 1/4072 348/687 |
| 2008/0292107 A1 | 11/2008 | Bizjak | |
| 2009/0015327 A1 | 1/2009 | Wu et al. | |
| 2009/0051423 A1 | 2/2009 | Miaille et al. | |
| 2010/0168882 A1 | 7/2010 | Zhang et al. | |
| 2010/0176980 A1 | 7/2010 | Breitschadel et al. | |
| 2010/0195771 A1 * | 8/2010 | Takahashi | H04L 27/14 375/324 |
| 2011/0029109 A1 | 2/2011 | Thomsen et al. | |
| 2011/0044414 A1 * | 2/2011 | Li | H04B 1/1081 375/350 |
| 2011/0188671 A1 | 8/2011 | Anderson et al. | |
| 2011/0228952 A1 | 9/2011 | Lin | |
| 2011/0268301 A1 | 11/2011 | Nielsen et al. | |
| 2011/0285436 A1 | 11/2011 | Walker et al. | |
| 2012/0007757 A1 * | 1/2012 | Choe | H03M 1/1061 341/120 |
| 2012/0059649 A1 * | 3/2012 | Yamaguchi | H04R 3/02 704/226 |

(56) References Cited

U.S. PATENT DOCUMENTS

| | | | |
|---|---|---|---|
| 2012/0274490 A1 | 11/2012 | Kidambi et al. | |
| 2012/0293348 A1 | 11/2012 | Snelgrove | |
| 2012/0314750 A1* | 12/2012 | Mehrabani | H04L 27/01 375/229 |
| 2013/0095870 A1 | 4/2013 | Phillips et al. | |
| 2013/0129117 A1 | 5/2013 | Thomsen et al. | |
| 2013/0235484 A1* | 9/2013 | Liao | G11B 20/10 360/39 |
| 2013/0241753 A1 | 9/2013 | Nozaki | |
| 2013/0241755 A1 | 9/2013 | Chen et al. | |
| 2014/0044280 A1 | 2/2014 | Jiang | |
| 2014/0126747 A1 | 5/2014 | Huang | |
| 2014/0363023 A1* | 12/2014 | Li | H03G 3/001 381/107 |
| 2014/0368364 A1 | 12/2014 | Hsu | |
| 2015/0170663 A1 | 6/2015 | Disch et al. | |
| 2015/0249466 A1 | 9/2015 | Elyada | |
| 2015/0327174 A1 | 11/2015 | Rajagopal et al. | |
| 2016/0139230 A1 | 5/2016 | Petrie et al. | |
| 2016/0181988 A1 | 6/2016 | Du et al. | |
| 2016/0365081 A1 | 12/2016 | Satoskar et al. | |
| 2017/0047895 A1 | 2/2017 | Zanbaghi | |
| 2017/0150257 A1 | 5/2017 | Das et al. | |
| 2017/0212721 A1 | 7/2017 | Satoskar et al. | |
| 2018/0046239 A1 | 2/2018 | Schneider | |
| 2018/0048325 A1 | 2/2018 | Schneider | |
| 2018/0098149 A1 | 4/2018 | Das | |

FOREIGN PATENT DOCUMENTS

| | | | |
|---|---|---|---|
| EP | 1689075 A1 | 8/2006 | |
| GB | 2527677 B | 10/2016 | |
| GB | 2537694 A | 10/2016 | |
| GB | 2537697 A | 10/2016 | |
| GB | 2539517 A | 12/2016 | |
| GB | 2552860 A | 2/2018 | |
| GB | 2552867 A | 2/2018 | |
| WO | 2004057754 A1 | 7/2004 | |
| WO | 2006018750 A1 | 2/2006 | |
| WO | 2007005380 A2 | 1/2007 | |
| WO | 2007136800 A2 | 11/2007 | |
| WO | 2016160336 A1 | 10/2016 | |
| WO | 2016202636 A1 | 12/2016 | |
| WO | 2017116629 A1 | 7/2017 | |
| WO | 2018031525 A1 | 2/2018 | |
| WO | 2018031646 A1 | 2/2018 | |

OTHER PUBLICATIONS

International Search Report and Written Opinion of the International Searching Authority, International Application No. PCT/US2016/040096, dated Mar. 24, 2017.

International Search Report and Written Opinion of the International Searching Authority, International Application No. PCT/US2017/014240, dated Apr. 24, 2017.

Chen, K., et al., A High-PSRR Reconfigurable Class-AB/D Audio Amplifier Driving a Hands-Free/Receiver 2-in-1 Loudspeaker, IEEE Journal of Solid-State Circuits, vol. 47, No. 11, Nov. 2012, pp. 2586-2603.

Groeneweg, B.R, et al., A Class-AB/D Audio Power Amplifier for Mobile Applications Integrated Into a 2.5G/3G Baseband Processor, IEEE Transactions on Circuits and Systems-I: Regular Papers, vol. 57, No. 5, May 2010, pp. 1003-1016.

Combined Search and Examination Report under Sections 17 and 18(3) of the UKIPO, Application No. GB1620427.3, dated Jun. 1, 2017.

Combined Search and Examination Report under Sections 17 and 18(3) of the UKIPO, Application No. GB1620428.1, dated Jul. 21, 2017.

Combined Search and Examination Report under Sections 17 and 18(3) of the UKIPO, Application No. GB1700371.6, dated Aug. 1, 2017.

International Search Report and Written Opinion of the International Searching Authority, International Application No. PCT/US2017/045861, dated Nov. 14, 2017.

International Search Report and Written Opinion of the International Searching Authority, International Application No. PCT/US2017/046083, dated Nov. 14, 2017.

International Search Report and Written Opinion of the International Searching Authority, International Application No. PCT/US2017/052439, dated Dec. 14, 2017.

Combined Search and Examination Report under Sections 17 and 18(3) of the UKIPO, Application No. GB1708546.5, dated Nov. 22, 2017.

Combined Search and Examination Report under Sections 17 and 18(3) of the UKIPO, Application No. GB1708544.0, dated Nov. 28, 2017.

Combined Search and Examination Report under Sections 17 and 18(3) of the UKIPO, Application No. GB1702540.4, dated Oct. 2, 2017.

Combined Search and Examination Report under Sections 17 and 18(3) of the UKIPO, Application No. GB1702655.0, dated Oct. 24, 2017.

Combined Search and Examination Report under Sections 17 and 18(3) of the UKIPO, Application No. GB1706693.7, dated Oct. 26, 2017.

Search Report under Section 17 of the UKIPO, Application No. GB1702656.8, dated Oct. 31, 2017.

Combined Search and Examination Report under Sections 17 and 18(3) of the UKIPO, Application No. GB1706690.3, dated Oct. 30, 2017.

Chen, Kuo-Hsin et al., A 106dB PSRR Direct Battery Connected Reconfigurable Class-AB/D Speaker Amplifier for Hands-Free/Receiver 2-in-1 Loudspeaker, Solid State Circuits Conference (A-SSCC), 2011 IEEE Asian, Nov. 14, 2011, pp. 221-224.

International Search Report and Written Opinion of the International Searching Authority, International Application No. PCT/US2018/026410, dated Jul. 6, 2018.

* cited by examiner

| MAGNITUDE OF ANALOG_IN (IN DECIBELS RELATIVE TO FULL SCALE MAGNITUDE) | WEIGHT APPLIED TO OUTPUT OF PROCESSING PATH 201a | WEIGHT APPLIED TO OUTPUT OF PROCESSING PATH 201b |
|---|---|---|
| ≥ -28 | 0.00 | 1.00 |
| -29 | 0.22 | 0.78 |
| -30 | 0.41 | 0.59 |
| -31 | 0.54 | 0.46 |
| -32 | 0.67 | 0.33 |
| -33 | 0.75 | 0.25 |
| -34 | 0.84 | 0.16 |
| -35 | 0.91 | 0.09 |
| ≤ -36 | 1.00 | 0.00 |

MULTI-PATH ANALOG FRONT END AND ANALOG-TO-DIGITAL CONVERTER FOR A SIGNAL PROCESSING SYSTEM

RELATED APPLICATIONS

The present patent application is a continuation-in-part of U.S. patent application Ser. No. 15/694,129, filed Sep. 1, 2017, which is a continuation of U.S. application Ser. No. 14/596,826 filed Jan. 14, 2015 (now U.S. Pat. No. 9,774,342), which is a continuation-in-part of U.S. application Ser. No. 14/476,507, filed Sep. 3, 2014 (now U.S. Pat. No. 9,525,940), which claims priority to U.S. Provisional Patent Application Ser. No. 61/948,307, filed Mar. 5, 2014. All of these applications are hereby incorporated by reference in their entireties.

The present patent application is related to U.S. Pat. Nos. 9,071,267, 9,071,268, and 9,148,164, all of which are hereby incorporated by reference in their entireties.

FIELD OF DISCLOSURE

The present disclosure relates in general to signal processing systems, and more particularly, to multiple path signal processing systems.

BACKGROUND

The use of multipath analog-to-digital converters (ADCs) and analog front ends (AFEs) (e.g., two or more path ADCs/AFEs) in electrical circuits is known. Example multipath ADCs and AFEs and use of them in multiple electrical circuit paths are disclosed in U.S. Pat. No. 5,714,956 entitled "Process and System for the Analog-to-Digital Conversion of Signals" to Jahne et al. ("Jahne patent"), and U.S. Pat. No. 5,600,317 entitled "Apparatus for the Conversion of Analog Audio Signals to a Digital Data Stream" to Knoth et al. ("Knoth patent"), and U.S. Pat. No. 6,271,780 entitled "Gain Ranging Analog-to-Digital Converter with Error Correction" to Gong et al. ("Gong patent"). The use of multipath circuits may reduce noise as one path may be optimized for processing small amplitude signals (e.g., for processing low noise signals) while another circuit path with another set of ADC and AFE is optimized for large amplitude signals (e.g., allowing for higher dynamic range).

An example application for multipath ADCs/AFEs is use of them in a circuit for an audio system application, such as an audio mixing board or in a digital microphone system. Such an example application is disclosed in the Jahne patent. In designing a circuit with multipath ADCs/AFEs that are used in respective multiple circuit paths, a tradeoff may exist between allowing larger signal swing (e.g., to allow swing of a signal between larger scale amplitudes) and low noise. Furthermore, the multipath ADCs/AFEs may provide high dynamic range signal digitization, with higher dynamic range for a given input power, and lower overall area than would be possible with conventional means. In other words, by allowing a separate optimization for each type of signal (e.g., large and small signals) that is provided each respective path, multipath ADCs/AFEs allow the overall circuit to burn less power, consume less area, and save on other such design costs.

Despite their advantages, existing multipath ADC/AFE approaches have disadvantages and problems. For example, many existing approaches have disadvantages related to transitioning and switching between the multiple paths, as such switching may not be smooth, leading to undesirable signal artifacts, especially in audio applications in which such artifacts may be perceptible to a listener of an audio device. As another example, a trend in electric circuits is to scale circuitry to the integrated circuit level. However, existing approaches to multipath AFEs/ADCs do not scale well to the integrated circuit level.

SUMMARY

In accordance with the teachings of the present disclosure, certain disadvantages and problems associated with implementation of multiple AFE/ADC paths may be reduced or eliminated.

In accordance with embodiments of the present disclosure, a processing system may include a plurality of processing paths and a controller. The plurality of processing paths includes a first processing path and a second processing path. The first processing path comprises a first analog front end and a first digital processing subsystem having a first analog-to-digital converter, wherein the first analog front end is configured to amplify an analog input signal in order to generate a first amplified analog signal and the first analog-to-digital converter is configured to convert the first amplified analog signal into a first digital signal. The second processing path comprises a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into a second digital signal, and further wherein a magnitude of the gain of the second analog front end is substantially larger than a magnitude of a gain of the first analog front end. The controller may be configured to select a weighted average of the first digital signal and the second digital signal as a digital output signal of the processing system based on a magnitude of the analog input signal.

In accordance with these and other embodiments of the present disclosure, a method may include processing an analog input signal with a first processing path, wherein the first processing path comprises a first analog front end and a first digital processing subsystem having a first analog-to-digital converter, wherein the first analog front end is configured to amplify the analog input signal in order to generate a first amplified analog signal and the first analog-to-digital converter is configured to convert the first amplified analog signal into a first digital signal. The method may also include processing the analog input signal with a second processing path, wherein the second processing path comprises a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into a second digital signal, and further wherein a magnitude of the gain of the second analog front end is substantially larger than a magnitude of a gain of the first analog front end. The method may further include selecting a weighted average of the first digital signal and the second digital signal as a digital output signal of the processing system based on a magnitude of the analog input signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
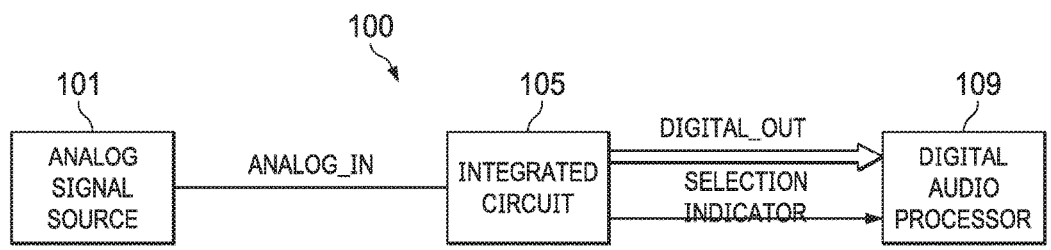
FIG. 1 illustrates a block diagram of selected components of an example signal processing system, in accordance with embodiments of the present disclosure.

FIG. 1 illustrates a block diagram of selected components of an example signal processing system 100, in accordance with embodiments of the present disclosure. As shown in FIG. 1, signal processing system 100 may include an analog signal source 101, an integrated circuit (IC) 105, and a digital processor 109. Analog signal source 101 may comprise any system, device, or apparatus configured to generate an analog electrical signal, for example an analog input signal ANALOG_IN. For example, in embodiments in which signal processing system 100 is a processing system, analog signal source 101 may comprise a microphone transducer.

Integrated circuit 105 may comprise any suitable system, device, or apparatus configured to process analog input signal ANALOG_IN to generate a digital output signal DIGITAL_OUT and condition digital output signal DIGITAL_OUT for transmission over a bus to digital audio processor 109. Once converted to digital output signal DIGITAL_OUT, the signal may be transmitted over significantly longer distances without being susceptible to noise as compared to an analog transmission over the same distance. In some embodiments, integrated circuit 105 may be disposed in close proximity with analog signal source 101 to ensure that the length of the analog line between analog signal source 101 and integrated circuit 105 is relatively short to minimize the amount of noise that can be picked up on an analog output line carrying analog input signal ANALOG_IN. For example, in some embodiments, analog signal source 101 and integrated circuit 105 may be formed on the same substrate. In other embodiments, analog signal source 101 and integrated circuit 105 may be formed on different substrates packaged within the same integrated circuit package. As also shown in FIG. 1, integrated circuit 105 may be configured to output a selection indicator to digital audio processor 109 downstream of integrated circuit 105 (e.g., "downstream" in the sense that digital audio processor 109 receives data communicated from integrated circuit 105), wherein such selection indicator identifies an analog path which was selected by integrated circuit 105 in generating digital output signal DIGITAL_OUT, as described in greater detail below.

Digital processor 109 may comprise any suitable system, device, or apparatus configured to process digital output signal DIGITAL_OUT for use in a digital system. For example, digital processor 109 may comprise a microprocessor, microcontroller, digital signal processor (DSP), application specific integrated circuit (ASIC), or any other device configured to interpret and/or execute program instructions and/or process data, such as digital output signal DIGITAL_OUT.

Signal processing system 100 may be used in any application in which it is desired to process an analog signal to generate a digital signal. Thus, in some embodiments, signal processing system 100 may be integral to an audio device that converts analog signals (e.g., from a microphone) to digital signals representing the sound incident on a microphone. As another example, signal processing system 100 may be integral to a radio-frequency device (e.g., a mobile telephone) to convert radio-frequency analog signals into digital signals.

Figure 2:
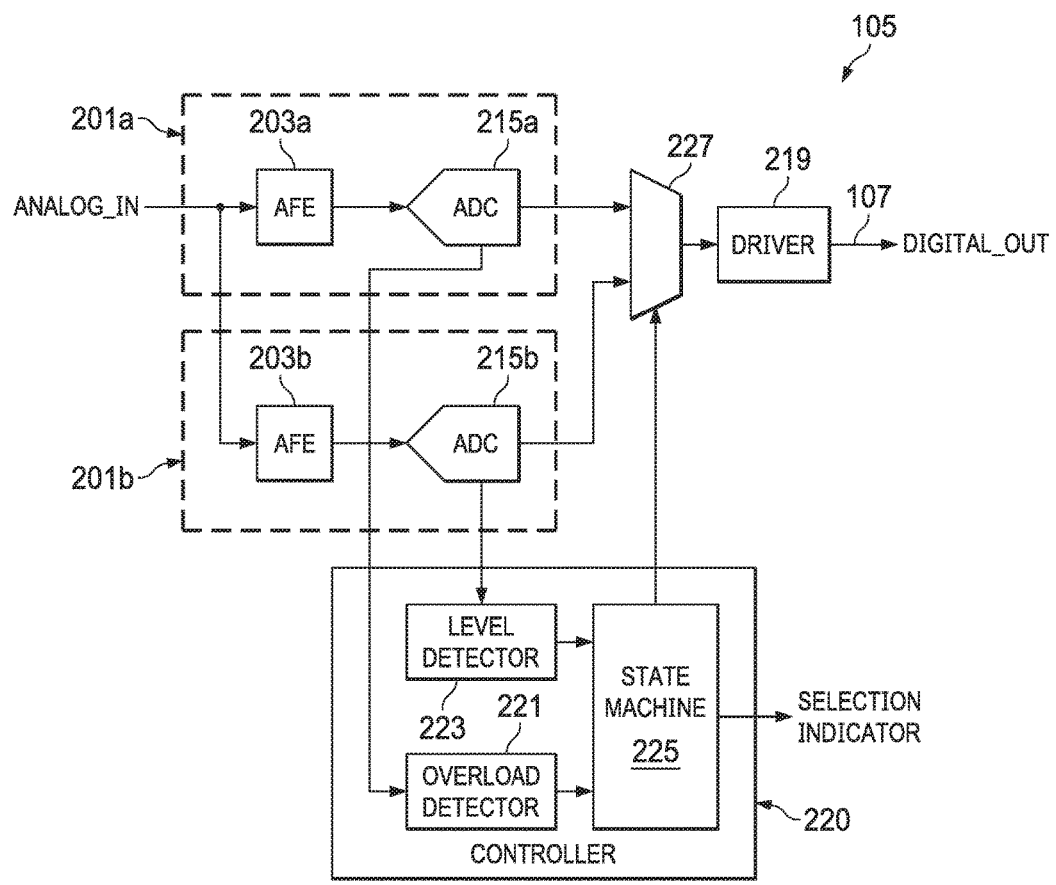
FIG. 2 illustrates a block diagram of selected components of an integrated circuit for processing an analog signal to generate a digital signal, in accordance with embodiments of the present disclosure.

FIG. 2 illustrates a block diagram of selected components of integrated circuit 105, in accordance with embodiments of the present disclosure. As shown in FIG. 2, integrated circuit 105 may include two or more processing paths 201a and 201b (which may be referred to herein individually as a processing path 201 and collectively as processing paths 201), each processing path 201 including a respective AFE 203 (e.g., AFE 203a, AFE 203b) and a respective ADC (e.g., ADC 215a, ADC 215b). An AFE 203 may receive analog input signal ANALOG_IN via one or more input lines which may allow for receipt of a single-ended signal, differential signal, or any other suitable analog signal format and may comprise any suitable system, device, or apparatus configured to condition analog input signal ANALOG_IN for processing by ADC 215. Selected components for example embodiments of AFEs 203a and 203b are discussed in greater detail below with respect to FIG. 3. The output of each AFE 203 may be communicated to a respective ADC 215 on one or more output lines.

An ADC 215 may comprise any suitable system, device, or apparatus configured to convert an analog signal received at its input, to a digital signal representative of analog input signal ANALOG_IN. ADC 215 may itself include one or more components (e.g., delta-sigma modulator, decimator, etc.) for carrying out the functionality of ADC 215. Selected components for the example embodiments of ADCs 215a and 215b are discussed in greater detail below with respect to FIG. 3.

A multiplexer 227 may receive a respective digital signal from each of processing paths 201 and may select one of the digital signals as digital output signal DIGITAL_OUT based on a control signal generated by and communicated from a controller 220.

Driver 219 may receive the digital signal DIGITAL_OUT output by ADC 215 and may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process generating digital output signal DIGITAL_OUT for transmission over a bus to digital processor 109. In FIG. 2, the bus receiving digital output signal DIGITAL_OUT is shown as single-ended. In some embodiments, driver 219 may generate a differential digital output signal 107.

Controller 220 may comprise any suitable system, device, or apparatus for selecting one of the digital signals output by the various processing paths 201 as digital output signal DIGITAL_OUT. In some embodiments, controller 220 may make such selection based on a magnitude of analog input signal ANALOG_IN or a signal derivative thereof. For example, controller 220 may include an overload detector 221 that may determine whether or not a signal derivative of analog input signal ANALOG_IN (e.g., an output of a modulator 316a of delta-sigma modulator 308a, as shown in greater detail in FIG. 3) is likely to cause clipping or other distortion of digital output signal DIGITAL_OUT if a particular processing path (e.g., processing path 201a) is selected. If clipping or other distortion of digital output signal DIGITAL_OUT is likely if the particular processing path (e.g., processing path 201a) is selected, state machine 225 of controller 220 may generate a control signal so that another processing path (e.g., processing path 201b) is selected. To further illustrate, in some embodiments, processing path 201a may be a path adapted for low amplitudes of analog input signal ANALOG_IN and may thus have a high signal gain, while processing path 201b may be a path adapted for higher amplitudes of analog input signal ANALOG_IN and may thus have a lower signal gain. Thus, if analog input signal ANALOG_IN or a derivative thereof is greater than a threshold value indicative of a condition whereby digital output signal DIGITAL_OUT may experience clipping or other distortion if processing path 201a is selected, overload detector 221 may detect such condition, and cause state machine 225 to generate a control signal to select the digital signal generated by processing path 201b as digital output signal DIGITAL_OUT.

In some embodiments, the control signal generated by state machine 225 may comprise a selection indicator that may be output to digital audio processor 109, and that may identify which of processing path 201a and processing path 201b was selected to generate digital audio output signal DIGITAL_OUT.

As another example, controller 220 may include a level detector 223 that may detect an amplitude of analog input signal ANALOG_IN or a signal derivative thereof (e.g., a signal generated within ADC 215b) and communicate a signal indicative of such amplitude to state machine 225. Responsive to the signal received from level detector 223, state machine 225 may generate the control signal communicated to multiplexer 227. To illustrate, as analog input signal ANALOG_IN decreases from a relatively high amplitude to a lower amplitude, it may cross a threshold amplitude level whereby controller 220 may change the selection of digital output signal DIGITAL_OUT from the digital signal generated by processing path 201b (which may be adapted for higher amplitudes of analog input signal ANALOG_IN) to the digital signal generated by processing path 201a (which may be adapted for lower amplitudes of analog input signal ANALOG_IN). In some embodiments, a threshold amplitude level whereby controller 220 may change the selection of digital output signal DIGITAL_OUT from the digital signal generated by processing path 201b to the digital signal generated by processing path 201a may be lower than another threshold amplitude level whereby controller 220 may change the selection of digital output signal DIGITAL_OUT from the digital signal generated by processing path 201a to the digital signal generated by processing path 201b, in order to provide for hysteresis so that multiplexer 227 does not repeatedly switch between the paths.

Figure 3:
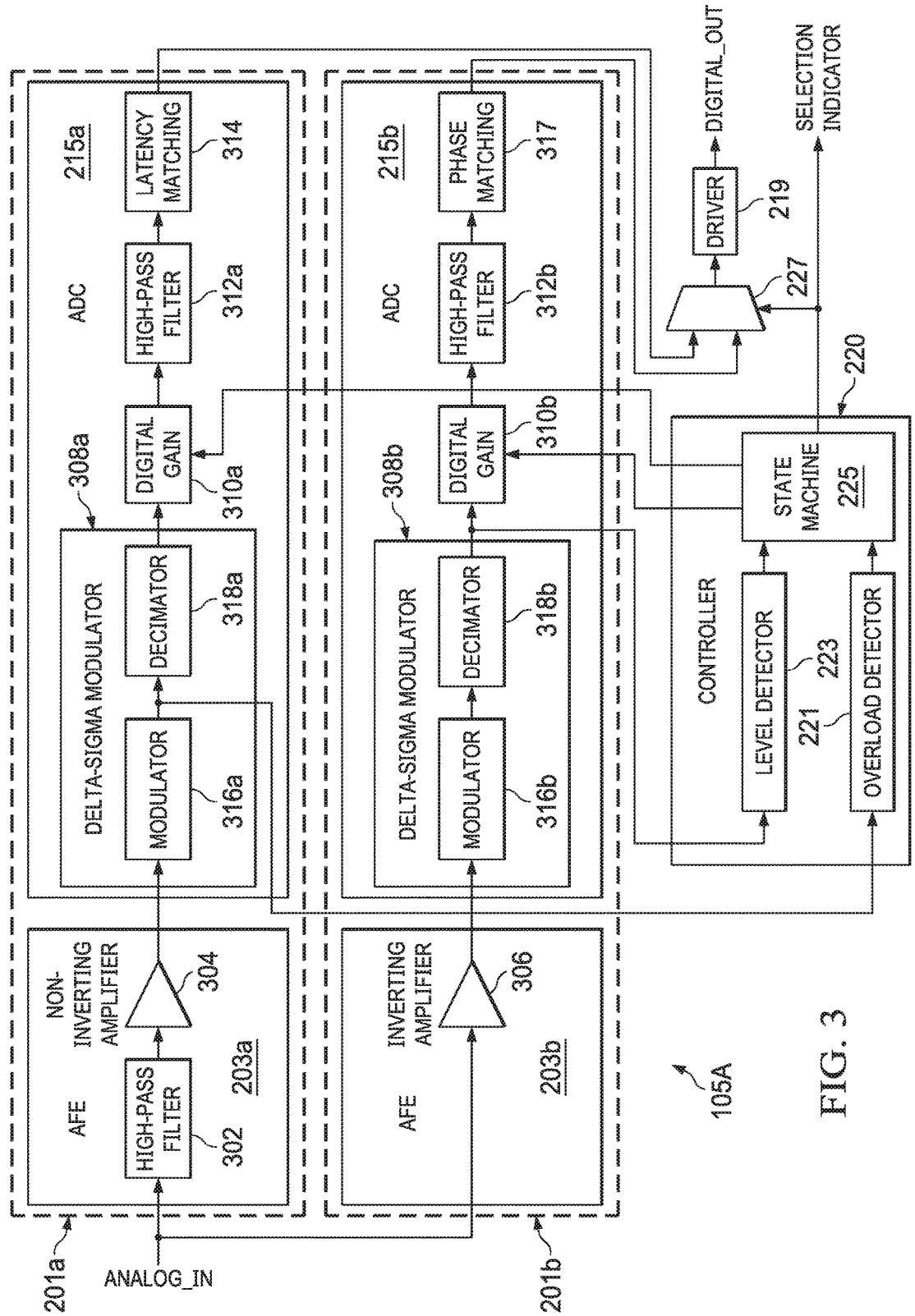
FIG. 3 illustrates a block diagram of selected components of the integrated circuit of FIG. 2 depicting selected components of example embodiments of analog front ends and analog-to-digital converters, in accordance with embodiments of the present disclosure.

FIG. 3 illustrates a block diagram of selected components of an integrated circuit 105A, which may be used to implement integrated circuit 105 depicted in FIGS. 1 and 2, and which depicts selected components of example embodiments of AFEs 203 and ADCs 215, in accordance with embodiments of the present disclosure. As shown in FIG. 3, analog front end 203a of processing path 201a may include a high-pass filter 302 configured to high-pass filter analog input signal ANALOG_IN to remove direct current offsets or biases, which are often particularly troublesome for high-gain amplifiers, and output such filtered signal to a non-inverting amplifier 304. Non-inverting amplifier 304 may amplify analog input signal ANALOG_IN by a non-inverting gain and communicate such amplified analog signal to ADC 215a. In some embodiments, high-pass filter 302 may be formed on the same integrated circuit as one or more of AFE 203a, AFE 203b, ADC 215a, and ADC 215b. Because of the presence of high-pass filter 302 in processing path 201a, but not processing path 201b, processing paths 201 may each have a different frequency response to analog input signal ANALOG_IN.

Also as shown in FIG. 3, analog front end 203b of processing path 201b may include an inverting amplifier 306 which may amplify analog input signal ANALOG_IN by an inverting gain and communicate such amplified analog signal to ADC 215b. In some embodiments, inverting amplifier 306 may be configured to apply a multiplicative gain of less than unity to analog input signal ANALOG_IN. By attenuating higher-amplitude signals, a greater dynamic range for analog input signal ANALOG_IN may be achieved, in spite of conventional wisdom that would generally dictate that signal loss should be avoided in a low-noise system. In these and other embodiments, although not depicted in FIG. 3, inverting amplifier 306 may receive the output of high-pass filter 302 instead of the unfiltered analog input signal ANALOG_IN.

Although AFEs 203a and 203b are described above having a non-inverting gain and an inverting gain, respectively, each of processing paths 201 may have approximately the same cumulative gain. Those of skill in the art may appreciate that simply applying a digital gain with a negative sign in either of ADC 215a or ADC 215b will negate the opposite polarities of the gains of AFEs 203.

As depicted in FIG. 3, each ADC 215 may include a respective delta-sigma modulator 308 (e.g., delta-sigma modulators 308a and 308b), a respective digital gain element 310 (e.g., digital gain elements 310a and 310b), and respective high-pass filters 312 (e.g., high-pass filters 312a and 312b). Each delta-sigma modulator 308 may be configured to modulate an analog signal into a corresponding digital signal. As known in the art, each delta-sigma modulator 308 may include a respective modulator 316 (e.g., modulators 316a, 316b) and a decimator 318 (e.g., decimators 318a, 318b). Each digital gain element 310 may apply a gain to a digital signal generated by its associated delta-sigma modulator 308. Each high-pass filter 312 may high-pass filter a digital signal generated by its associated digital gain element, to filter out any direct-current offsets present in the digital signal. High-pass filter 312b may also compensate for high-pass filter 302 present in AFE 203a.

In addition, ADC 215a may comprise a latency matching element 314 to match any signal latencies between processing path 201a and processing path 201b, while ADC 215b may comprise a phase matching element 317 to account for any phase offset between processing path 201a and processing path 201b. For example, phase matching element 317 may dynamically compensate for any phase mismatch between processing paths 201a and 201b by varying a delay of at least one of processing path 201a and processing path 201b. In some embodiments, phase matching element 317 may comprise a high-pass compensation filter. In such embodiments, phase matching element 317 may dynamically compensate for the phase mismatch by varying a corner frequency of such compensation filter.

It is understood that integrated circuit 105A as shown in FIG. 3 represents a portion of the possible embodiments of the systems and methods described herein. For example, in some embodiments, the various elements of the signal paths disclosed in FIG. 3 may be rearranged without departing from the spirit and scope of the disclosure. As a particular example, the positions of digital gain element 310a and high-pass filter 312a may be reversed (e.g., such that high-pass filter 312a high-pass filters the output of delta-sigma modulator 308a and passes such result to digital gain element 310a which in turns passes its output to latency matching block 314) and the positions of digital gain element 310b and high-pass filter 312b may be reversed (e.g., such that high-pass filter 312b high-pass filters the output of delta-sigma modulator 308b and passes such result to digital gain element 310b which in turns passes its output to phase matching block 317). Any other suitable rearrangement of signal path components may also be employed.

In some embodiments, a magnitude of a gain of non-inverting amplifier 304 may be substantially larger than (e.g., significantly more than manufacturing tolerances, one or more orders of magnitude) a magnitude of a gain of inverting amplifier 306. In addition, in these and other embodiments, a magnitude of digital gain element 310b may be substantially larger than (e.g., significantly more than manufacturing tolerances, one or more orders of magnitude) a magnitude of a gain of digital gain element 310a. Consequently, in such embodiments, a first path gain equal to the product of the magnitude of the gain of inverting amplifier 306 and the magnitude of a gain of digital gain element 310b may be substantially equal (e.g., within manufacturing tolerances) to a second path gain equal to the product of the magnitude of gain of non-inverting amplifier 304 and the gain of digital gain element 310a. As a specific example, in some embodiments, the inverting gain of inverting amplifier 306 may be approximately −6 decibels, the non-inverting gain of non-inverting amplifier 304 may be approximately 20 decibels, the gain of digital gain element 310a may be approximately −26 decibels, and the gain of digital gain element 310b may be approximately 0 decibels.

Accordingly, each processing path 201 may be adapted to process a particular amplitude of analog input signal ANALOG_IN. For example, AFE 203a may be suited to process lower signal amplitudes, as non-inverting amplifier 304 may have a practically infinite input resistance, may have a relatively low level of input-referred noise as compared to inverting amplifier 306, and its larger gain may permit effective processing of smaller signals, but characteristics of AFE 203a may not be amenable to higher amplitudes. The high input resistance of non-inverting amplifier 304 may facilitate the use of a smaller capacitor area for high-pass filter 302 (as compared to traditional approaches for implementing high-pass filters) and thus may permit integration of circuitry of high-pass filter 302 into the same integrated circuit as non-inverting amplifier 304, inverting amplifier 306, ADC 215a, and/or ADC 215b. In addition, the ability to integrate circuitry into a single integrated circuit may allow for centralized control of the stimuli for switching between processing paths 201 by controller 220, and may allow for more direct timing control of the actual switching and transitioning between processing paths 201. For example, because circuitry is integrated into a single integrated circuitry, level detector 223 may receive an output of delta-sigma modulator 308b as an input signal, rather than receiving an output of ADC 215b.

On the other hand, AFE 203b may be suited to process higher signal amplitudes, as its lower gain will reduce the likelihood of signal clipping, and may provide for greater dynamic range for analog input signal ANALOG_IN as compared to traditional approaches.

Despite a designer's best efforts to match the first path gain and the second path gain, process variations, temperature variations, manufacturing tolerances, and/or other variations may lead to the first path gain and the second path gain being unequal. If switching between paths occurs when such path gains are unequal, signal artifacts may occur due to an instantaneous, discontinuous change in magnitude of the digital output signal between two gain levels. For example, in audio signals, such artifacts may include human-perceptible "pops" or "clicks" in acoustic sounds generated from audio signals. In some embodiments, in order to reduce or eliminate the occurrence of such artifacts when switching selection between the digital output signal of ADC 215a and the digital output signal of ADC 215b, and vice versa, controller 220 may program an additional gain into one or both of processing paths 201 to compensate for differences in the first path gain and second path gain. This additional gain factor may equalize the first path gain and the second path gain. To illustrate, controller 220 may determine a scale factor indicative of the magnitude of difference (e.g., whether an intentional difference or unintentional mismatch) between the first path gain of processing path 201a and the second path gain of processing path 201b. The controller may determine the first path gain and the second path gain by comparing the digital output signals of each processing path to analog input signal ANALOG_IN or a derivative thereof. If such digital output signals have been filtered by a high-pass filter (e.g., high-pass filters 312), a direct-current offset between the signals may be effectively filtered out, which may be necessary to accurately compute the relative path gains. Controller 220 may determine the scale factor by calculating one of a root mean square average of the first path gain and the second path gain and a least mean squares estimate of the difference between the first path gain and the second path gain. Prior to switching selection between the first digital signal generated by ADC 215a and the second digital signal generated by ADC 215b (or vice versa), controller 220 may program an additional gain into one of processing paths 201 to compensate for the gain difference indicated by the scale factor. For example, controller 220 may calibrate one or both of the first path gain and the second path gain by applying a gain equal to the scale factor or the reciprocal of the gain factor (e.g., 1/gain factor), as appropriate. Such scaling may be performed by modifying one or both of digital gains 310. In some embodiments, controller 220 may apply the additional gain to the processing path 201 of the digital signal not selected as digital output signal DIGITAL_OUT. For example, controller 220 may apply the additional gain to processing path 201*a* when the digital signal of ADC 215*b* is selected as digital output signal DIGITAL_OUT and apply the additional gain to processing path 201*b* when the digital signal of ADC 215*a* is selected as digital output signal DIGITAL_OUT.

In some embodiments, the additional gain, once applied to a path gain of a processing path 201, may be allowed over a period of time to approach or "leak" to a factor of 1, in order to constrain the additional gain and compensate for any cumulative (e.g., over multiple switching events between digital signals of ADCs 215) bias in the calculation of the additional gain. Without undertaking this step to allow the additional gain to leak to unity, multiple switching events between paths may cause the gain factor to increase or decrease in an unconstrained manner as such additional gain, if different than unity, affects the outputs of the multiple paths and thus affects the calculation of the scaling factor.

In some embodiments, switching selection of digital output signal DIGITAL_OUT from the digital signal of ADC 215*a* to the digital signal of ADC 215*b* (or vice versa), may occur substantially immediately. However, in some embodiments, to reduce or eliminate artifacts from occurring when switching selection of digital output signal DIGITAL_OUT from the digital signal of ADC 215*a* to the digital signal of ADC 215*b* (or vice versa), controller 220 and multiplexer 227 may be configured to transition, continuously or in steps, digital output signal DIGITAL_OUT from a first digital signal to a second digital signal such that during such transition, digital output signal DIGITAL_OUT is a weighted average of the first digital signal and the second digital signal wherein a weight of the second digital signal relative to a weight of the first digital signal increases during the transition. For example, if a transition is desired between the digital signal of ADC 215*a* and the digital signal of ADC 215*b* as digital output signal DIGITAL_OUT, such transition may be in steps, wherein in each step, controller 220 and/or multiplexer 227 weighs digital signals output by ADCs 215 as follows:

1) 100% digital signal of ADC 215*a* and 0% digital signal of ADC 215*b*;
2) 80% digital signal of ADC 215*a* and 20% digital signal of ADC 215*b*;
3) 60% digital signal of ADC 215*a* and 40% digital signal of ADC 215*b*;
4) 30% digital signal of ADC 215*a* and 70% digital signal of ADC 215*b*;
5) 10% digital signal of ADC 215*a* and 90% digital signal of ADC 215*b*; and
6) 0% digital signal of ADC 215*a* and 100% digital signal of ADC 215*b*.

As another example, if a transition is desired between the digital signal of ADC 215*b* and the digital signal of ADC 215*a* as digital output signal DIGITAL_OUT, such transition may be in steps, wherein in each step, controller 220 and/or multiplexer 227 weighs digital signals output by ADCs 215 as follows:

1) 100% digital signal of ADC 215*b* and 0% digital signal of ADC 215*a*;
2) 70% digital signal of ADC 215*b* and 30% digital signal of ADC 215*a*;
3) 60% digital signal of ADC 215*b* and 40% digital signal of ADC 215*a*;
4) 20% digital signal of ADC 215*b* and 80% digital signal of ADC 215*a*;
5) 5% digital signal of ADC 215*b* and 95% digital signal of ADC 215*a*; and
6) 0% digital signal of ADC 215*b* and 100% digital signal of ADC 215*a*.

In one or more of these embodiments, when transitioning digital output signal DIGITAL_OUT (either continuously or in steps) from the digital signal of ADC 215*a* to the digital signal of ADC 215*b* (or vice versa), the selection indicator output by state machine 225 and communicated to digital audio processor 109 may also indicate the relative weighting of digital output signal DIGITAL_OUT between the digital signal of ADC 215*a* and the digital signal of ADC 215*b*.

In some embodiments, a transition in digital output signal DIGITAL_OUT (either continuously or in steps) from the digital signal of ADC 215*a* to the digital signal of ADC 215*b* (or vice versa) may occur over a defined maximum duration of time. In these and other embodiments, when transitioning (either continuously or in steps) digital output signal DIGITAL_OUT from the digital signal of ADC 215*b* to the digital signal of ADC 215*a*, a rate of transition may be based on a magnitude of analog input signal ANALOG_IN (e.g., the rate of transition may be faster at lower amplitudes and slower at higher amplitudes). In such embodiments, the minimum rate of such transition may be limited such that the transition occurs over a defined maximum duration of time, wherein the maximum duration of time is independent of the magnitude of the analog input signal.

In these and other embodiments, controller 220 may be configured to power down or otherwise disable all or a portion of a processing path 201 when the digital output signal of the other processing path 201 is selected as digital output signal DIGITAL_OUT in order to reduce power consumption. For example, if the digital output signal of ADC 215*a* is selected as digital output signal DIGITAL_OUT, controller 220 may cause all or a portion of processing path 201*b* to power down. As another example, additionally or alternatively, if the digital output signal of ADC 215*b* is selected as digital output signal DIGITAL_OUT, controller 220 may cause all or a portion of processing path 201*a* to power down.

Once communicated to digital audio processor 109, the selection indicator signal may be used by digital audio processor 109 in order to determine a downstream digital process to be applied to the output signal. For example, the selection indicator may infer and/or be indicative of one of more characteristics of digital audio output signal DIGITAL_OUT, including without limitation noise present in digital audio input signal DIGITAL_OUT, disturbance present in digital audio input signal DIGITAL_OUT, fidelity of digital audio input signal DIGITAL_OUT, and/or other characteristics. Based on such characteristics, digital audio processor 109 may carry out appropriate processing on digital audio output signal DIGITAL_OUT.

Figure 4:
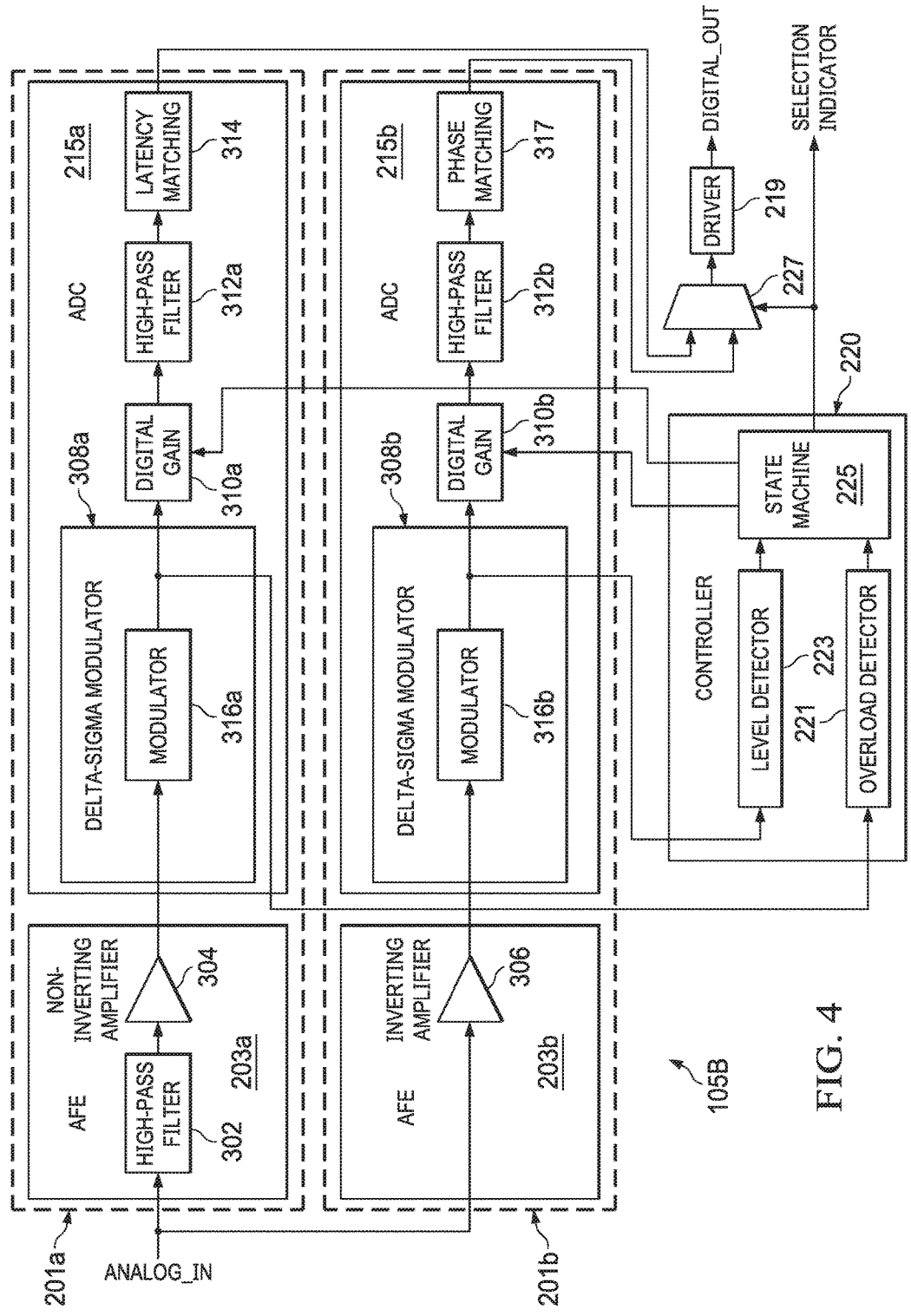
FIG. 4 illustrates a block diagram of selected components of the integrated circuit of FIG. 2 depicting selected components of other example embodiments of analog front ends and analog-to-digital converters, in accordance with embodiments of the present disclosure.

FIG. 4 illustrates a block diagram of selected components of an integrated circuit 105B, which may be used to implement integrated circuit 105 depicted in FIGS. 1 and 2, and which depicts selected components of example embodiments of AFEs 203 and ADCs 215, in accordance with embodiments of the present disclosure. Integrated circuit 105B is similar to integrated circuit 105A, so only those differences between integrated circuit 105B and integrated circuit 105A are discussed with reference to FIG. 4. As shown in FIG. 4, delta-sigma modulators 308*a* and 308*b* do not include decimators 318, such that each of delta-sigma modulators 308a and 308b output the digital signal generated by their respective modulators 316. Such absence of decimators 318 may render integrated circuit 105B suitable for use with audio systems that employ adaptive noise cancellation (ANC).

Figures 5, 6:
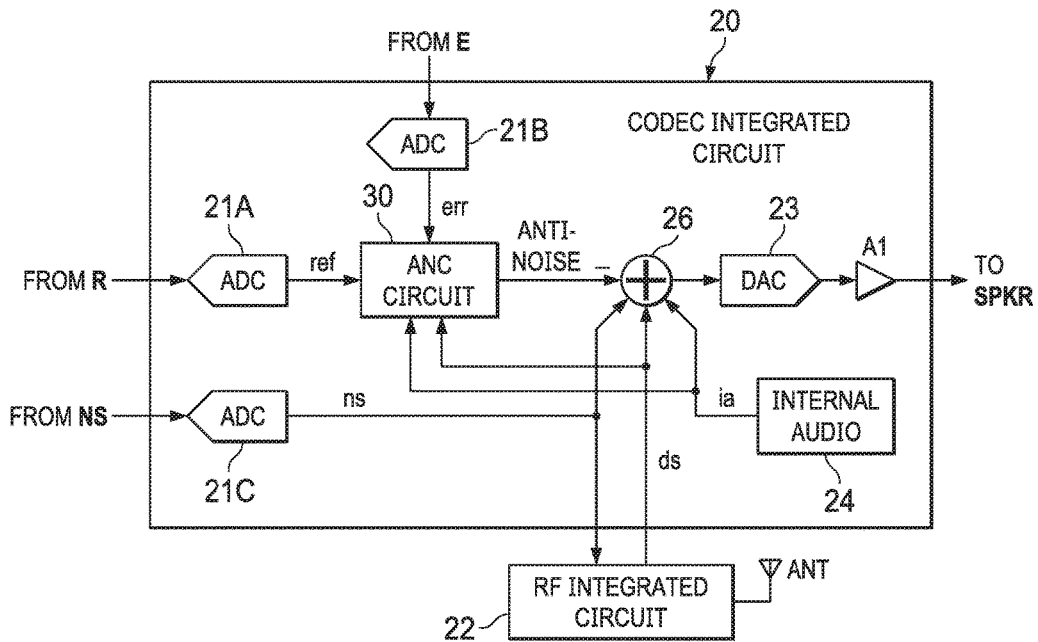
FIG. 5 illustrates a block diagram of a CODEC integrated circuit and a radio-frequency integrated circuit which may be implemented at least in part by the integrated circuit of FIG. 2, in accordance with embodiments of the present disclosure.
FIG. 6 depicts an example table of various weights applied to respective digital signals output by two processing paths in order to generate a weighted average output based on various magnitudes of an analog input signal, in accordance with embodiments of the present disclosure.

FIG. 5 illustrates a block diagram of a radio-frequency integrated circuit 22, which may be implemented at least in part by integrated circuit 105, and a CODEC integrated circuit 20 coupled to radio-frequency integrated circuit 22, in accordance with embodiments of the present disclosure. CODEC IC 20 may include an analog-to-digital converter (ADC) 21A for receiving a reference microphone signal from a reference microphone R indicative of ambient audio sounds proximate to an audio transducer and generating a digital representation ref of the reference microphone signal, an ADC 21B for receiving an error microphone signal from an error microphone E indicative of the acoustic output of the audio transducer and the ambient audio sounds at the transducer and generating a digital representation err of the error microphone signal, and an ADC 21C for receiving a near speech microphone signal from a near speech microphone NS and generating a digital representation ns of the near speech microphone signal. CODEC IC 20 may generate an output for driving speaker SPKR from an amplifier A1, which may amplify the output of a digital-to-analog converter (DAC) 23 that receives the output of a combiner 26. Combiner 26 may combine audio signals is from internal audio sources 24, the anti-noise signal generated by ANC circuit 30, which by convention has the same polarity as the noise in reference microphone signal ref and is therefore subtracted by combiner 26, and a portion of near speech microphone signal ns so that the user of a device comprising CODEC IC 20 may hear his or her own voice in proper relation to downlink speech ds, which may be received from radio frequency (RF) integrated circuit 22 and may also be combined by combiner 26. Near speech microphone signal ns may also be provided to RF integrated circuit 22 and may be transmitted as uplink speech to a service provider via antenna ANT. ANC circuit 30 may comprise any suitable system, device, or apparatus for generating anti-noise based on one or more of reference microphone signal ref and error microphone signal err, as is known in the art.

One possible disadvantage of the techniques described above is that a significant change in noise floor of the system may occur when changing between selection of processing path 201a and processing path 201b, and vice versa. Such change in noise floor may be audible to a listener (especially for low-frequency content) and could cause a sharp step in total harmonic distortion noise versus amplitude much different than that of a standard ADC path.

To minimize or eliminate such disadvantage, in some embodiments, state machine 225 of controller 220 may be configured to, based on the magnitude of analog input signal ANALOG_IN, output to multiplexer 227 a control signal that represents a weighted average of the digital signal output by processing path 201a and the digital signal output by processing path 201b to be combined by multiplexer 227 to generate digital output signal DIGITAL_OUT. In such embodiments, multiplexer 227 may operate as a mixer, mixing appropriate weighted amounts of the digital signal output by processing path 201a and the digital signal output by processing path 201b to generate digital output signal DIGITAL_OUT.

As an example, FIG. 6 depicts an example table 600 of various weights applied to the digital signal output by processing path 201a and the digital signal output by processing path 201b in order to generate the weighted average output by multiplexer 227 based on various magnitudes of analog input signal ANALOG_IN. The various weights and magnitudes set forth in table 600 are examples, and any suitable weights and magnitudes may be used. In some embodiments, the weights for each level of magnitude of analog input signal ANALOG_IN may be chosen, based on the respective noise floors of processing paths 201, such that the output of multiplexer 227 while having an increasing or decreasing amplitude in the range of transition between digital signal output by processing path 201a and the digital signal output by processing path 201b to optimize a total harmonic distortion noise versus amplitude relationship of digital output signal DIGITAL_OUT such that the relationship is smoother than that which would be present if mixing between digital signal output by processing path 201a and the digital signal output by processing path 201b was not existent.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:
1. A processing system comprising:
a plurality of processing paths including a first processing path and a second processing path, wherein:
the first processing path comprises a first analog front end and a first digital processing subsystem having a first analog-to-digital converter, wherein the first analog front end is configured to amplify an analog input signal in order to generate a first amplified analog signal and the first analog-to-digital converter is configured to convert the first amplified analog signal into a first digital signal; and
the second processing path comprises a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into a second digital signal, and further wherein a magnitude of a gain of the second analog front end is substantially larger than a magnitude of a gain of the first analog front end; and a controller configured to select a weighted average of the first digital signal and the second digital signal as a digital output signal of the processing system based on a magnitude of the analog input signal.

2. The processing system of claim 1, wherein a first path gain equal to the product of the gain of the first analog front end and the first digital processing subsystem is substantially equal to a second path gain equal to the product of the gain of the second analog front end and the second digital processing subsystem.

3. The processing system of claim 2, wherein the controller is further configured to:

determine a scale factor indicative of the magnitude of difference between the first path gain and the second path gain; and prior to switching selection between the first digital signal and the second digital signal, apply an additional gain based on the scale factor to one or both of the first path gain and the second path gain to compensate for the magnitude of difference between the first path gain and the second path gain.

4. The processing system of claim 3, wherein the controller is configured to determine the scale factor by calculating one of a root mean square average of the first path gain and the second path gain and a least mean squares estimate of the difference between the first path gain and the second path gain.

5. The processing system of claim 1, wherein the controller is further configured to:

determine a phase mismatch between the first digital signal and the second digital signal; and dynamically compensate for the phase mismatch by varying a delay of at least one of the first processing path and the second processing path.

6. The processing system of claim 1, wherein the processing system is an audio processing system, and the analog input signal and the digital output signal are each an audio signal.

7. The processing system of claim 1, wherein the first analog front end includes an inverting amplifier configured to amplify an analog input signal to generate a first amplified analog signal.

8. The processing system of claim 7, wherein a magnitude of gain of the inverting amplifier is substantially less than a unity gain.

9. The processing system of claim 1, wherein the second analog front end includes a non-inverting amplifier configured to amplify the analog input signal to generate a second amplified analog signal.

10. The processing system of claim 9, wherein the second analog front end includes a high-pass filter configured to filter the analog input signal prior to the analog input signal being amplified by the non-inverting amplifier.

11. The processing system of claim 10, wherein the high-pass filter is formed on the same integrated circuit as the first analog front end, the second analog front end, the first digital processing subsystem, and the second digital processing subsystem.

12. The processing system of claim 10, wherein the first digital processing system further comprises a digital high-pass filter configured to filter an output of the first analog-to-digital converter in order to compensate for the high-pass filter.

13. The processing system of claim 9, wherein the first analog front end includes an inverting amplifier configured to amplify an analog input signal to generate a first amplified analog signal.

14. The processing system of claim 13, wherein a magnitude of a gain of the non-inverting amplifier is substantially larger than a magnitude of a gain of the inverting amplifier.

15. The processing system of claim 1, wherein the first processing path has a frequency response different than a frequency response of the second processing path.

16. The processing system of claim 1, wherein the controller is further configured to apply respective weights to each of the first digital signal and the second digital signal for respective levels of the magnitude of the analog input signal based on respective noise floors of the first processing path and the second processing path in order to optimize a total harmonic distortion noise versus amplitude relationship of the digital output signal.

17. A method comprising:

processing an analog input signal with a first processing path, wherein the first processing path comprises a first analog front end and a first digital processing subsystem having a first analog-to-digital converter, wherein the first analog front end is configured to amplify the analog input signal in order to generate a first amplified analog signal and the first analog-to-digital converter is configured to convert the first amplified analog signal into a first digital signal;

processing the analog input signal with a second processing path, wherein the second processing path comprises a second analog front end and a second digital processing subsystem having a second analog-to-digital converter, wherein the second analog front end is configured to amplify the analog input signal to generate a second amplified analog signal and the second analog-to-digital converter is configured to convert the second amplified analog signal into a second digital signal, and further wherein a magnitude of a gain of the second analog front end is substantially larger than a magnitude of a gain of the first analog front end; and selecting a weighted average of the first digital signal and the second digital signal as a digital output signal of the processing system based on a magnitude of the analog input signal.

18. The method of claim 17, wherein a first path gain equal to the product of the gain of the first analog front end and the first digital processing subsystem is substantially equal to a second path gain equal to the product of the gain of the second analog front end and the second digital processing subsystem.

19. The method of claim 18, further comprising:

determining a scale factor indicative of the magnitude of difference between the first path gain and the second path gain; and prior to switching selection between the first digital signal and the second digital signal, applying an additional gain based on the scale factor to one or both of the first path gain and the second path gain to compensate for the magnitude of difference between the first path gain and the second path gain.

20. The method of claim 19, further comprising determining the scale factor by calculating one of a root mean square average of the first path gain and the second path gain and a least mean squares estimate of the difference between the first path gain and the second path gain.

21. The method of claim 17, further comprising:
determining a phase mismatch between the first digital signal and the second digital signal; and
dynamically compensating for the phase mismatch by varying a delay of at least one of the first processing path and the second processing path.

22. The method of claim 17, wherein the processing system is an audio processing system, and the analog input signal and the digital output signal are each an audio signal.

23. The method of claim 17, wherein the first analog front end includes an inverting amplifier configured to amplify an analog input signal to generate a first amplified analog signal.

24. The method of claim 23, wherein a magnitude of gain of the inverting amplifier is substantially less than a unity gain.

25. The method of claim 17, wherein the second analog front end includes a non-inverting amplifier configured to amplify the analog input signal to generate a second amplified analog signal.

26. The method of claim 25, wherein the second analog front end includes a high-pass filter configured to filter the analog input signal prior to the analog input signal being amplified by the non-inverting amplifier.

27. The method of claim 26, wherein the high-pass filter is formed on the same integrated circuit as the first analog front end, the second analog front end, the first digital processing subsystem, and the second digital processing subsystem.

28. The method of claim 26, wherein the first digital processing system further comprises a digital high-pass filter configured to filter an output of the first analog-to-digital converter in order to compensate for the high-pass filter.

29. The method of claim 25, wherein the first analog front end includes an inverting amplifier configured to amplify an analog input signal to generate a first amplified analog signal.

30. The method of claim 29, wherein a magnitude of a gain of the non-inverting amplifier is substantially larger than a magnitude of a gain of the inverting amplifier.

31. The method of claim 17, wherein the first processing path has a frequency response different than a frequency response of the second processing path.

32. The method of claim 17, further comprising applying respective weights to each of the first digital signal and the second digital signal for respective levels of the magnitude of the analog input signal based on respective noise floors of the first processing path and the second processing path in order to optimize a total harmonic distortion noise versus amplitude relationship of the digital output signal.

* * * * *

UNITED STATES PATENT AND TRADEMARK OFFICE
CERTIFICATE OF CORRECTION

PATENT NO. : 10,284,217 B1
APPLICATION NO. : 15/882640
DATED : May 7, 2019
INVENTOR(S) : Schneider et al.

Page 1 of 1

It is certified that error appears in the above-identified patent and that said Letters Patent is hereby corrected as shown below:

In the Specification

1. In Column 11, Line 28, delete "signal is" and insert -- signal ia --, therefor.

Signed and Sealed this
Twenty-ninth Day of October, 2019

Andrei Iancu
*Director of the United States Patent and Trademark Office*